US009209055B2

(12) United States Patent
Hiroki (10) Patent No.: US 9,209,055 B2
(45) Date of Patent: Dec. 8, 2015

(54) SUBSTRATE PROCESSING APPARATUS

(71) Applicant: TOKYO ELECTRON LIMITED, Tokyo (JP)

(72) Inventor: Tsutomu Hiroki, Nirasaki (JP)

(73) Assignee: TOKYO ELECTRONICS LIMITED (JP)

( * ) Notice: Subject to any disclaimer, the term of this patent is extended or adjusted under 35 U.S.C. 154(b) by 187 days.

(21) Appl. No.: 14/057,287

(22) Filed: Oct. 18, 2013

(65) Prior Publication Data

US 2014/0044505 A1 Feb. 13, 2014

Related U.S. Application Data

(62) Division of application No. 12/880,640, filed on Sep. 13, 2010, now abandoned.

(30) Foreign Application Priority Data

Sep. 14, 2009 (JP) .................... 2009-212373

(51) Int. Cl.
*H01L 21/677* (2006.01)
*H01L 21/67* (2006.01)
*B65G 49/00* (2006.01)

(52) U.S. Cl.
CPC ...... *H01L 21/67745* (2013.01); *H01L 21/6719* (2013.01); *H01L 21/67196* (2013.01); *H01L 21/67201* (2013.01); *H01L 21/67766* (2013.01); *H01L 21/67778* (2013.01); *B65G 49/00* (2013.01)

(58) Field of Classification Search
CPC ............ H01L 21/67769; H01L 21/67766; H01L 21/67778; H01L 21/67751; H01L 21/67745; H01L 21/67201; H01L 21/6719; H01L 21/67748; H01L 21/67196; H01L 21/67184
See application file for complete search history.

(56) References Cited

U.S. PATENT DOCUMENTS

| | | | |
|---|---|---|---|
| 5,509,771 A | 4/1996 | Hiroki | |
| 6,568,896 B2 | 5/2003 | Franklin et al. | |
| 6,841,200 B2 | 1/2005 | Kraus et al. | |
| 6,852,194 B2 | 2/2005 | Matsushita et al. | |
| 6,896,513 B2 | 5/2005 | Bachrach et al. | |
| 6,908,865 B2 | 6/2005 | Kranz et al. | |
| 6,930,050 B2 | 8/2005 | Kim et al. | |
| 7,025,554 B2 | 4/2006 | Ozawa et al. | |
| 7,381,969 B2* | 6/2008 | Fasheh | H01L 21/67201 118/719 |
| 7,959,403 B2 | 6/2011 | Van Der Meulen | |
| 7,988,812 B2* | 8/2011 | Kim | H01L 21/67161 118/719 |
| 7,993,458 B2 | 8/2011 | Kondo et al. | |
| 8,197,177 B2 | 6/2012 | Van Der Meulen et al. | |
| 8,382,088 B2 | 2/2013 | Kondoh | |
| 8,434,989 B2 | 5/2013 | Van Der Meulen | |
| 8,999,103 B2* | 4/2015 | Wakabayashi | H01L 21/32137 156/345.31 |
| 2002/0153578 A1* | 10/2002 | Aggarwal | H01L 21/67769 257/400 |
| 2011/0229289 A1* | 9/2011 | Nogi | H01L 21/67745 414/217 |

FOREIGN PATENT DOCUMENTS

JP 2008053550 3/2008
WO 9839799 9/1998

* cited by examiner

*Primary Examiner* — Glenn Myers
(74) *Attorney, Agent, or Firm* — Cantor Colburn LLP (57) ABSTRACT

A bypass route is provided in order to transfer a substrate without passing through the atmospheric pressure transfer chamber, that is, a loader module, from a load lock chamber to a storage. In the bypass route, a sub-transfer unit for transferring the processed substrate from the load lock chamber to the storage is provided. The sub-transfer unit transfers the processed substrate from the load lock chamber to the storage, and a main transfer unit of the loader module returns the processed substrate from the storage to a transport container on holding stage.

4 Claims, 9 Drawing Sheets

SUBSTRATE PROCESSING APPARATUS

CROSS-REFERENCE TO RELATED PATENT APPLICATIONS

This application is a divisional application of prior U.S. application Ser. No. 12/880,640, filed on Sep. 13, 2010, the entire contents of which are incorporated herein by reference, and this application claims the benefit of Japanese Patent Application No. 2009-212373, filed on Sep. 14, 2009, in the Japan Patent Office, the disclosure of which is incorporated herein in its entirety by reference.

BACKGROUND OF THE INVENTION

1. Field of the Invention

The present invention relates to a substrate processing apparatus and method for performing a vacuum process with respect to a substrate such as a semiconductor wafer, a substrate for a liquid crystal display, or an organic EL device.

2. Description of the Related Art

In manufacturing semiconductor devices or FPDs (flat panel displays), various processes such as film formation, etching, oxidation, and dispersion are performed to a semiconductor wafer (hereinafter, referred to as the wafer) or a substrate for a liquid crystal display. In order to perform the above processes with a high throughput, a substrate processing apparatus that is referred to as a multi-chamber system is used.

Figure 9:
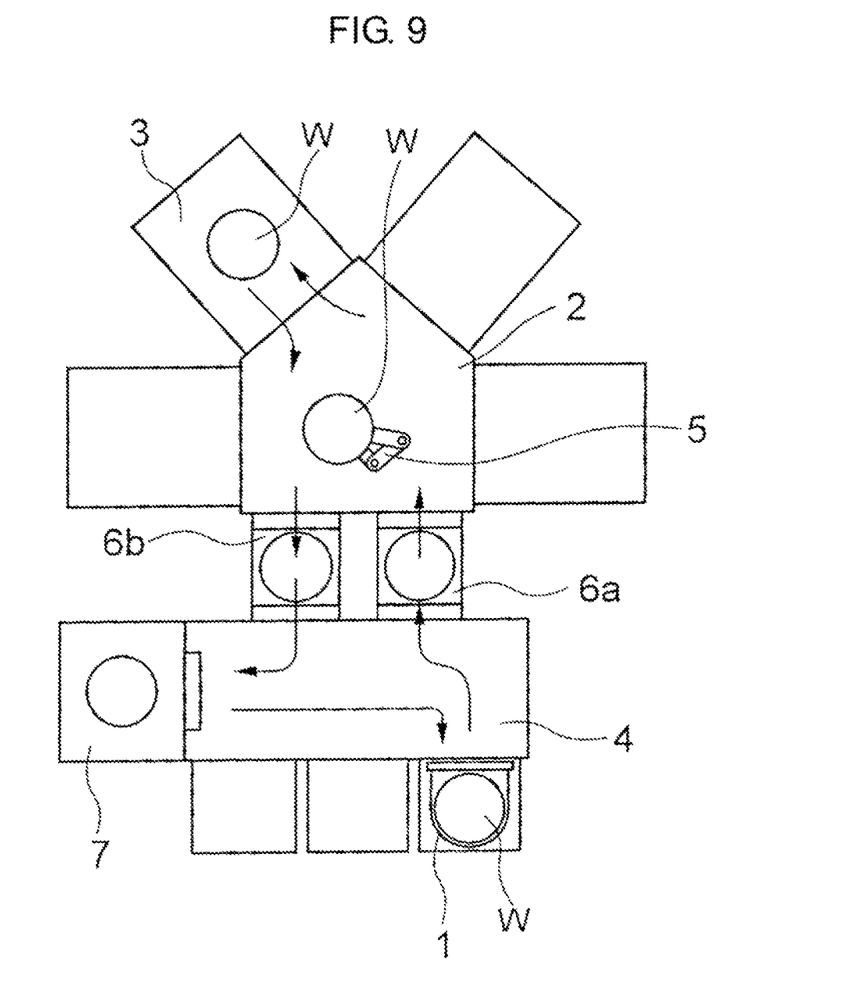
FIG. 9 is a schematic plan view of a substrate processing apparatus according to the conventional art.

As shown in FIG. 9, an example of the substrate processing apparatus includes a FOUP holding stage 1 on which a front opening unified pod (FOUP) that is a transport container receiving a plurality of wafers is mounted, a transfer module (TM) 2 having a transfer arm 5 for transferring wafers W and disposed in a vacuum atmosphere, a plurality of process modules (PMs) 3 disposed around the TM 2 and performing predetermined processes with respect to the wafers W under the vacuum atmosphere, a loader module (LM) 4 including a main transfer unit that has a transfer arm for transferring the wafers W and disposed in an atmospheric pressure, two load lock modules (LLMs) 6a and 6b disposed between the LM 4 and the TM 2 and switchable between the vacuum atmosphere and the atmospheric pressure, and an orienter (ORT) (not shown) provided adjacent to the LM 4 for pre-aligning orientation of the wafers W.

In the above substrate processing apparatus, the wafer W is transferred in a following route, for example. The wafer W that is unprocessed and mounted on the FOUP holding stage 1 is transferred in order of the LM 4, the ORT, the LLM 6a, the TM 2, and the PM 3. In addition, after undergoing a process, for example, an etching process, under a predetermined processing gas atmosphere in the PM 3, the processed wafer W is transferred in order of the TM 2, the LLM 6b, the LM 4, and the FOUP holding stage 1.

Recently, a problem has occurred, that is, for some kind of the processing gas, when the processed wafer W returns to the LM 4, the wafer W reacts with moisture in the air, and then discharges a corrosive gas to the vicinity thereof. In addition, in some case, since the reaction for generating the corrosive gas lasts for a predetermined time, the corrosive gas contaminates the unprocessed wafers W in the FOUP to which the processed wafer returns. For example, in the PM 3, a processing gas, for example, HBr gas or $Cl_2$ gas, may be plasmatized for etching a polysilicon film formed on the wafer W. In this case, products (silicon bromide or silicon chloride) accompanied with the etching process remain on the wafer W. Recently, since line widths of patterns of the wafer W have been reduced due to a fine design rule of the wafer W, by-products are more likely to remain between structures formed on the wafer W. When the wafer W is transferred to the LM 4 that is under the atmospheric pressure, the silicon bromide or silicon chloride reacts with the moisture in the air to generate the corrosive gas such as hydrogen bromide or hydrogen chloride, and then scatters. In addition, the corrosive gas reacts with a very small amount of ammonia that exists in the air, so that particles such as ammonium bromide or ammonium chloride are generated and dispersed in the LM 4.

To address the above problems, as shown in FIG. 9, a purge storage 7 is provided in the substrate processing apparatus in order to temporarily store the processed wafer W under the atmospheric pressure. The corrosive gas that is generated by the reaction of the processed wafer W with the air may be removed in the purge storage 7, and thus, discharge of the corrosive gas from the wafer W that returns to the FOUP can be prevented.

However, when the processed wafer W is transferred from the LLM 6b to the purge storage 7, the wafer W passes through the LM 4. Since the LM 4 is a chamber that transfers the wafer W under the atmospheric pressure, the wafer W may discharge the corrosive gas on entering the LM 4. Therefore, a metal portion of the LM 4, for example, a wall portion of a transfer chamber or a transfer unit may be corroded, and the corroded portion may cause metal contamination due to friction caused by a movement of a machine, for example. In order to prevent the corrosion and the metal contamination, large-scale countermeasures against the corrosion are performed, for example, reinforced exhaustion, surface process of the wall portion in the transfer chamber (Teflon™ coating or alumite processing), and selection of a corrosion-resistant material.

However, the large-scale countermeasures against the corrosion increase costs of the LM. Recently, since the substrate processing apparatus is requested to have low costs, improved reliability, reinforced safety, and reduced maintenance costs, the LM that may not require, or may reduce, the countermeasures against the corrosion has been required. In order to reduce the influence of the corrosive gas on the LM, Patent Document 1 discloses a substrate processing apparatus, in which the purge storage is disposed to be adjacent to the load lock module so that the processed substrate is transferred from the load lock module to the purge storage by a main transfer unit of the loader module.

(Patent Document 1) Japanese Laid-open Patent Publication No. 2008-53550

However, in the substrate processing apparatus disclosed in Patent Document 1, a part of the main transfer unit (for example, a transferring arm unit that transfers the wafer) may contact the corrosive gas, and the corrosive gas generated in the purge storage may flow into the loader module. Thus, the countermeasures against the corrosion disclosed in Patent Document 1 cannot completely prevent the corrosion. Moreover, one main transfer unit disposed on the loader module performs both of the transferring of the wafer from the load lock module to the purge storage and the returning of the wafer from the purge storage to the FOUP holding stage, and thus, a throughput of the substrate processing apparatus is reduced.

SUMMARY OF THE INVENTION

The present invention provides a substrate processing apparatus and method, which does not require a large-scale countermeasure against corrosion of a loader module and does not reduce a throughput.

In an embodiment of the present invention, there is provided a substrate processing apparatus including: a holding stage on which a transport container receiving a plurality of substrates is placed; a depressurized process chamber which processes the substrate under a depressurized atmosphere; a load lock chamber which transfers the substrate from/to the depressurized process chamber, and is switchable between the depressurized atmosphere and an atmospheric pressure; an atmospheric pressure transfer chamber which has a main transfer unit for transferring the substrate received in the transport container from the holding stage to the load lock chamber under the atmospheric pressure; and a storage that holds the processed substrate under an atmosphere of a pressure higher than the pressure of the depressurized atmosphere, wherein a bypass route may be provided in order to transfer the processed substrate from the load lock chamber to the storage without passing through the atmospheric pressure transfer chamber, a sub-transfer unit may be provided in the bypass route for transferring the processed substrate from the load lock chamber to the storage, and the main transfer unit in the atmospheric pressure transfer chamber may transfer the processed substrate from the storage to the transport container on the holding stage.

In another embodiment of the present invention, there is provided a substrate processing method including: transferring an unprocessed substrate that is received in a transport container on a holding storage from the holding stage to a load lock chamber of an atmospheric pressure by a main transfer unit in an atmospheric pressure transfer chamber; transferring the unprocessed substrate from the load lock chamber to the depressurized process chamber and performing a process with respect to the substrate in a depressurized process chamber; transferring the processed substrate from the depressurized process chamber to the load lock chamber of a depressurized atmosphere; switching an inner space of the load lock chamber from the depressurized atmosphere to the atmospheric pressure; transferring the processed substrate from the load lock chamber to a storage; holding the processed substrate in the storage under an environment of a pressure that is greater than the pressure of the depressurized atmosphere; and transferring the processed substrate from the storage to the transport container on the holding stage by the main transfer unit of the atmospheric pressure transfer chamber, wherein the substrate processing method may include: transferring the processed substrate from the load lock chamber to the storage without passing through the atmospheric pressure transfer chamber, by a sub-transfer unit formed in a bypass route which bypasses the processed substrate from the load lock chamber to the storage; and returning the processed substrate from the storage to the transport container of the holding stage by the main transfer unit of the atmospheric pressure transfer chamber.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 1:
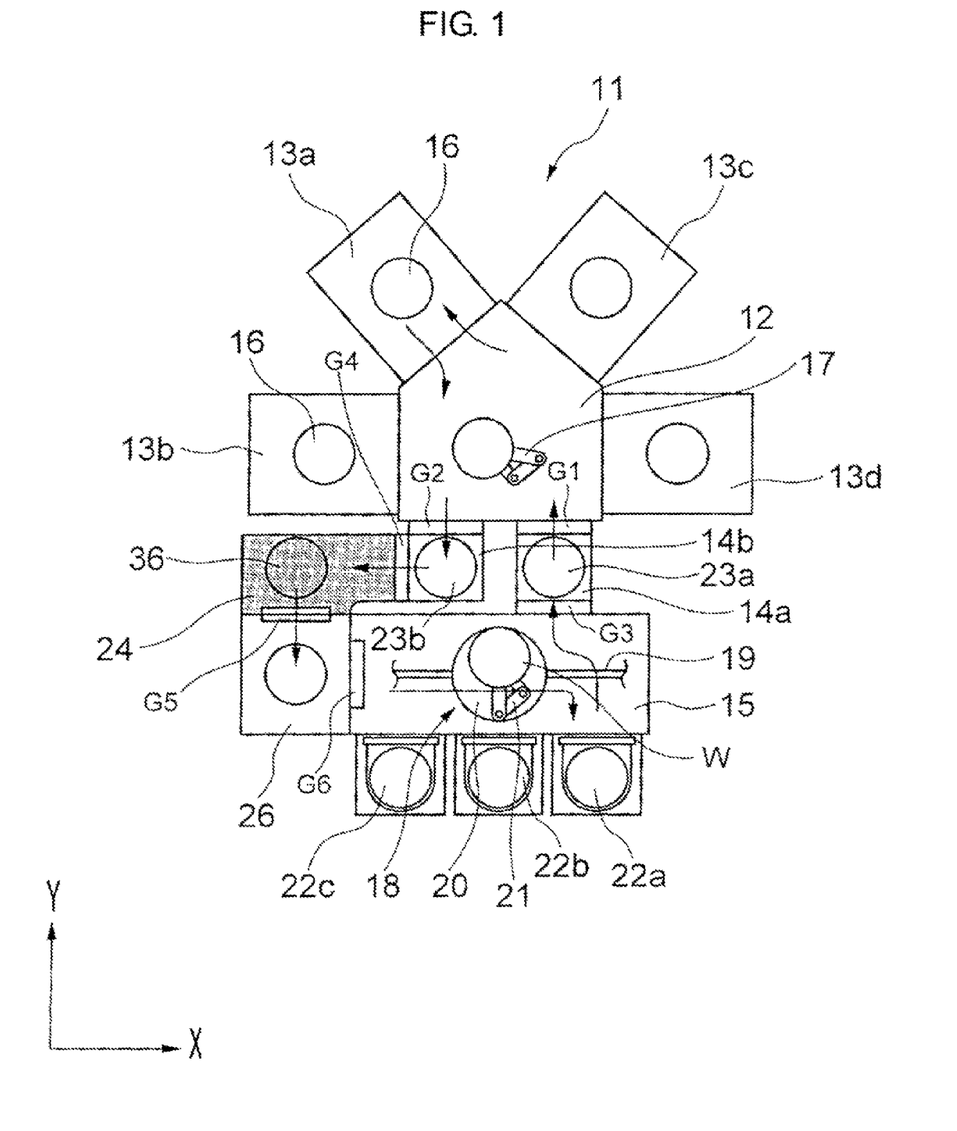
FIG. 1 is a schematic plan view of a substrate processing apparatus according to an embodiment of the present invention.
Figure 2:
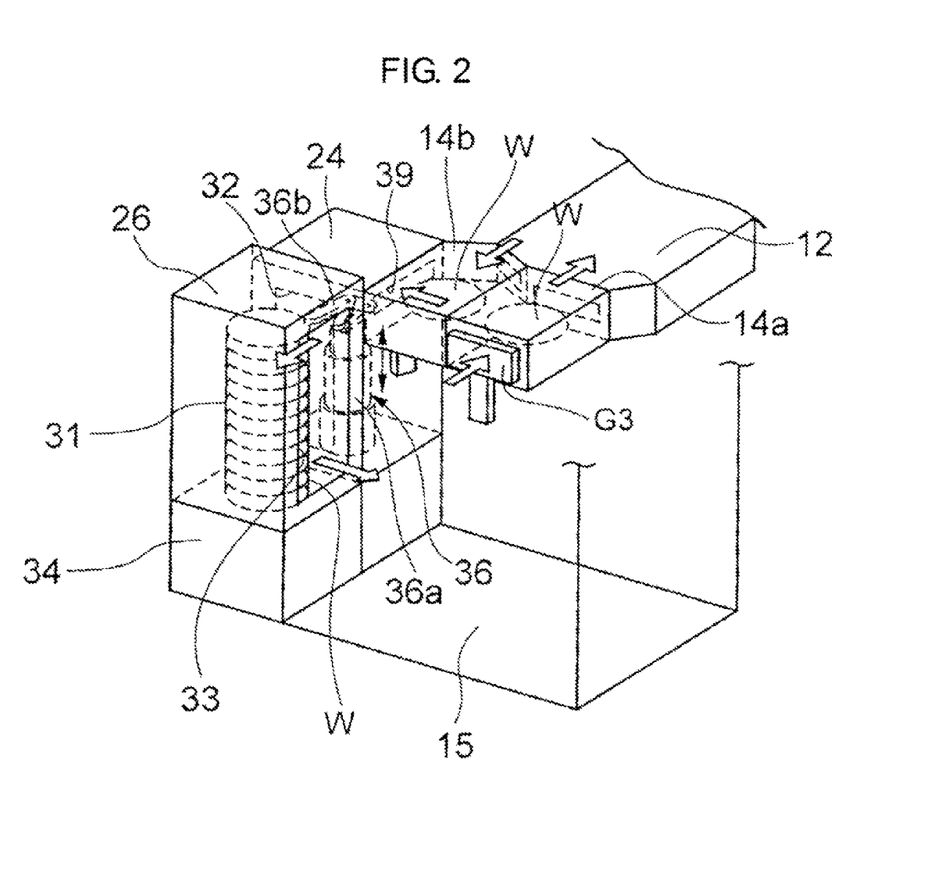
FIG. 2 is a schematic perspective view of the substrate processing apparatus according to the embodiment of the present invention.

Hereinafter, a transferring module according to an embodiment of the present invention will be described with reference to the accompanying drawings. FIG. 1 is a schematic plan view of a substrate processing apparatus according to an embodiment of the present invention, and FIG. 2 is a schematic perspective view of the substrate processing apparatus according to the embodiment of the present invention. In FIG. 1, reference numeral 11 denotes a substrate processing apparatus of a single type for performing predetermined processes by transferring a semiconductor wafer (hereinafter, referred to as the wafer W) one by one. The substrate processing apparatus 11 includes a transfer module (TM) 12 having an approximate pentagonal plane, two process modules (PMs) 13a and 13b disposed on longitudinal side surfaces (a Y-axis direction of FIG. 1) in one side of the TM 12, two process modules PM 13c and 13d disposed on the other longitudinal side surfaces (the Y-axis direction of FIG. 1) in the other side of the TM 12, two load lock modules (LLMs) 14a and 14b disposed on a transverse side surface (an X-axis direction of FIG. 1) of the TM 12, and a loader module 15 that is an atmospheric pressure transfer chamber and disposed so as to be lined up with the load lock modules 14a and 14b. In addition, the LLM 14a corresponds to a load lock chamber that is exclusive for input, and the LLM 14b corresponds to a load lock chamber that is exclusive for output.

Each of the process modules 13a through 13d that are depressurized process chambers includes a wafer holding stage 16 for placing the wafer W, a plasma generating electrode, and a processing gas supply unit for supplying a process gas, for example, hydrogen bromide (HBr) gas. A high frequency electric power is applied to the electrode so as to plasmatize the processing gas, and an etching process for etching a polysilicon film, for example, formed on the wafer W is performed by using the plasma.

Gate valves are formed on portions where the transfer module 12 and each of the process modules 13a through 13d are connected to each other, respectively. An articulated transfer arm unit 17 of a SCARA type or a Frog-leg type, which is swivelable horizontally and expandable/contractible between a radial direction and horizontal direction, is formed on the transfer module 12. The transfer arm unit 17 transfers the wafer W between each of the process modules 13a through 13d and each of the load lock modules 14a and 14b.

The loader module 15 is formed in a box shape having long-length in a transverse direction. A main transfer unit 18 is provided in the loader module 15. The main transfer unit 18 includes a X-axis moving unit that may be movable forward and backward along with a guide rail 19 disposed in the loader module 15 in a length direction of the loader module 15, a swivel board 20 that is horizontally swivelable via a Z-axis moving unit that is formed on the X-axis moving unit to be capable of elevating, and an articulated arm 21 formed on the swivel board 20 to be extractable/contractible between a radial direction and a horizontal direction. A wafer holding portion of the articulated arm 21 is formed in a fork shape, for example, and supports a peripheral portion of a lower surface of the wafer W. Three FOUP holding stages 22a through 22c are mounted on the loader module 15. Three wafer carry-in/carry-out openings, as inlets of the wafer W, are formed on a front surface of the loader module 15 on which the three FOUP holding stages 22a through 22c are mounted.

A fan filter unit (FFU) combining a fan and a filter is provided on a top portion of the loader module 15, and an exhaust fan unit is provided on a bottom surface of the loader module 15. The exhaust fan unit is connected to a factory exhaust system including a harm-removal apparatus, and downdraft of clean air is generated between the FFU and the exhaust fan unit.

The FOUP holding stages 22a through 22c, on which FOUPs are placed, are provided on the front surface side of the loader module 15. FOUPs are transport containers and include a plurality of wafers W, for example, 25 wafers, received through the wafer carry-in/carry-out openings, respectively. An orienter (ORT) (not shown) is provided on an end portion of the loader module 15 in the length direction (the right side surface of the loader module 15 of FIG. 1) and performs a pre-alignment of locations of the wafers W transferred into the loader module 15 from the FOUP holding stages 22a through 22c.

The load lock modules 14a and 14b are disposed between a rear surface portion of the loader module 15 and the transfer module 12. Gate valves G1 and G2 are respectively formed on connecting portions between the load lock modules 14a and 14b and the transfer module 12. The load lock modules 14a and 14b respectively include wafer holding stages 23a and 23b, on which the wafers W are placed, and are configured to switch pressures in the load lock modules 14a and 14b between a predetermined vacuum atmosphere and an atmospheric pressure, for example, the atmospheric pressure of nitrogen gas.

The load lock modules 14a and 14b is divided into the load lock module 14a that is exclusive for input and the load lock module 14b that is exclusive for output. The load lock module 14a exclusive for input is connected to the loader module 15, and a gate valve G3 is formed on a connecting portion between the load lock module 14a and the loader module 15. On the other hand, the load lock module 14b exclusive for output is not connected to the loader module 15, but is connected to a bypass route 24. A gate valve G4 is formed on a connecting portion between the load lock module 14b exclusive for output and the bypass route 24. A cooling stage for cooling down the processed wafer W is formed in the load lock module 14b exclusive for output. A flow passage, in which a refrigerant flows, is formed in the cooling stage.

A purge storage 26 as a storage is mounted on an end surface wall of the loader module 15 in the length direction thereof. The purge storage 26 scatters corrosive gas that is generated when the processed wafer W is exposed to the atmospheric pressure.

As shown in FIG. 2, a carry-in opening 32 is formed on a portion where the purge storage 26 and the bypass route 24 are connected to each other, and a carry-out opening 33 is formed on a portion where the purge storage 26 and the loader module 15 are connected to each other. The carry-in opening 32 and the carry-out opening 33 are formed in a vertically-long shape so that the plurality of wafers W that are received in a fixed shelf 31 in an up-and-down direction may be transferred into/from. Gate valves G5 and G6 are provided on the carry-in opening 32 and the carry-out opening 33 which have the vertically-long shape and make an inner space of the purge storage 26 air-tight the longitudinal direction. Countermeasures against corrosion, for example, surface treatments such as a Teflon™ coating and an alumite process, or selection of a corrosion-resistant material, are performed on a wall portion of the purge storage 26. The exhaust fan unit 34 as an exhaust device is connected to a bottom surface of the purge storage 26, and the exhaust fan unit 34 is also connected to the factory exhaust system including the harm-removal apparatus. The purge storage 26 is configured so that the clean air that is introduced from the loader module 15 through the carry-out opening 33 is exhausted to the factory exhaust system via the exhaust fan unit 34. The fan filter unit FFU combining the fan and the filter is provided on a top portion of the purge storage 26 and thus downdraft of the clean air may be formed between the FFU formed on the top portion of the purge storage 26 and the exhaust fan unit 34.

The fixed shelf 31 is disposed in the purge storage 26 and receives the plurality of wafers W in the up-and-down direction. A plurality of receiving portions for receiving the wafers W in the up-and-down direction are formed in the fixed shelf 31. The fixed shelf 31 includes, for example, a base stage that is provided on the bottom surface of the purge storage 26, a plurality of pillars that are arranged on the base stage in an erect manner, and supporting portions that are arranged on each of the plurality of pillars with constant intervals in the up-and-down direction.

The bypass route 24 is a chamber for transferring the processed wafer W from the load lock module 14b exclusive for output to the purge storage 26, and is connected to the load lock module 14b and the purge storage 26. A carry-in opening 39 is formed as a thin and horizontally long slit on a connecting portion between the bypass route 24 and the load lock module 14b exclusive for output, and the carry-in opening 39 is opened/closed by the gate valve G4. A carry-out opening (the carry-in opening 32 of the purge storage 26) is formed on a connecting portion between the bypass route 24 and the purge storage 26, and the carry-out opening is opened/closed by a gate valve G5. Countermeasures against corrosion, for example, surface treatments such as the Teflon™ coating and the alumite process, or selection of a corrosion-resistant material, are performed on a wall portion of the bypass route 24. A pressure in an inner space of the bypass route 24 is kept around the atmospheric pressure due to air. The fan filter unit FFU and the exhaust fan unit are formed in the bypass route 24 so that normal air may flow at a constant wind velocity.

A sub-transfer unit 36 is provided in the bypass route 24 and transfers the processed wafer W from the load lock module 14b exclusive for output to the purge storage 26. The sub-transfer unit 36 includes an up-and-down driving axis 36a for moving the wafer W in the up-and-down direction, and an articulated arm transfer mechanism 36b that is formed on an upper end portion of the up-and-down driving axis 36a, is swivelable horizontally, and is expanded/contracted between a radial direction and a horizontal direction. A wafer holding portion of the arm transfer unit 36b is formed as a folk, for example, and supports a peripheral portion of the lower surface of the wafer W.

The substrate processing apparatus 11 includes a control unit. The control unit may be a computer, and is configured to control operation sequences of the main transfer unit 18, the sub-transfer unit 36, and the gate valves G1 through G6, and vacuum process sequences performed in the process modules 13a through 13d by using a computer program. The program is stored in a memory medium such as hard disk, a flexible disk, a compact disk, a magnet optical (MO) disk, or a memory card, and then, is downloaded to the control unit from the memory medium.

Next, operations of the substrate processing apparatus 11 will be described as follow. First, when the FOUP receiving the wafer W is placed, for example, on the FOUP holding stage 22a, a cover body of the FOUP is opened and the unprocessed wafer W is extracted by the main transfer unit 18 through the carry-in/carry-out opening and transferred into the loader module 15. The unprocessed wafer W is transferred to the orienter after passing through the loader module 15, and a location of the wafer W is aligned in the orienter. Subsequently, the wafer W is extracted from the orienter by the main transfer unit 18, and then, is transferred to the load lock module 14a that is exclusive for input after passing through the loader module 15.

Consequently, when the unprocessed wafer W is placed on the wafer holding stage 23a of the load lock module 14a exclusive for input, the inner space of the load lock module 14a is switched from the atmospheric pressure to the vacuum atmosphere. The unprocessed wafer W in the load lock module 14a is extracted by the transfer arm unit 17, and is transferred into the transfer module 12. The unprocessed wafer W is transferred to the process module 13a, for example, after passing through the transfer module 12, and then, the plasma process, for example, the etching process is performed in the process module 13a.

After performing the process on the wafer W, the processed wafer W is extracted from the process module 13a by the transfer arm unit 17, and then, the wafer W is transferred to the load lock module 14b that is exclusive for output after passing through the transfer module 12. In addition, an inert gas, for example, nitrogen gas, is supplied into the load lock module 14b from an inert gas supply source (not shown) so that the inner space of the load lock module 14b is switched from the vacuum atmosphere to the atmospheric pressure. Since the inner space of the load lock module 14b is filled with the nitrogen gas, the corrosive gas is not generated in the load lock module 14b that is returned to the atmospheric pressure. After that, the gate valve G4 is opened so that the processed wafer W is extracted from the load lock module 14b exclusive for output by sub-transfer unit 36 and is transferred to the purge storage 26.

The transfer of the processed wafer W from the load lock module 14b to the purge storage 26 by the sub-transfer unit 36 will be described with reference to FIG. 2. The processed wafer W is supported by a lift pin that is located slightly upper than the cooling stage in the load lock module 14b. The sub-transfer unit 36 in the bypass route 24 extends the wafer holding portion of the arm transfer mechanism 36b in a radial direction so that the wafer holding portion is inserted into a lower side of the wafer W supported by the lift pin. After that, the sub-transfer unit 36 elevates the wafer holding portion so as to collect the wafer W from the lift pin in the load lock module 14b. Next, the sub-transfer unit 36 draws the wafer W into the bypass route 24, and then, swivels the arm transfer mechanism 36b horizontally so as to turn toward the purge storage 26. Next, the sub-transfer unit 36 drives the up-and-down driving axis 36a to elevate or descend the arm transfer mechanism 36b to a height level of an empty receiving portion of the fixed shelf 31. While the sub-transfer unit 36 moves the arm transfer mechanism 36b in the up-and-down direction, the gate valve G5 at the carry-in opening 32 of the purge storage 26 is opened. After that, the sub-transfer unit 36 extends the arm transfer mechanism 36b in the radial direction so as to pass the wafer W to the receiving portion at a predetermined height level.

Processes of the wafer W in the purge storage 26 will be described as follows. The inside of purge storage 26 is in an exhausted state at all times by the exhaust fan unit 34, and thus, by the negative pressure, the air in the loader module 15 is introduced into the purge storage 26 through the carry-out opening 33 of the purge storage 26. Here, if the fan filter unit is provided at the top portion of the purge storage 26, the air is introduced from the top portion of the purge storage 26. Since the wafer W is plasma-etched, silicon bromide, silicon chloride, etc. are attached onto the wafer W. Thus, the silicon bromide, the silicon chloride, etc. react with the moisture in the air to generate hydrogen bromide gas or hydrogen chloride gas, and the hydrogen bromide gas reacts with a small amount of ammonia in the air to generate particles of ammonium bromide. The hydrogen bromide gas that is the corrosive gas and the particles are exhausted through the exhaust fan unit 34 along with exhaust flow. In order to prevent the corrosive gas from leaking to the load lock module 14b or the loader module 15 during processing the wafer W in the purge storage 26, the gate valves G5 and G6 formed at the carry-in opening 32 and the carry-out opening 33 are closed unless the wafer W passes through the carry-in and carry-out openings 32 and 33, and thus, the air-tightness of the purge storage 26 is kept.

The wafer W should be left under the atmospheric pressure of the purge storage 26 as long as possible in order to remove products from the wafer W. The number of receiving portions of the fixed shelf 31 is determined according to the period of time of placing the wafer W in the purge storage 26. The more the number of receiving portions is, the longer the wafer W can be placed in the purge storage 26.

The main transfer unit 18 returns the wafer W, on which the products are removed in the purge storage 26, into the FOUP on the FOUP holding stage 22a, for example, and additionally, may collect a next wafer W from the FOUP and transfer the wafer W to the load lock module 14a.

According to the current embodiment of the present invention, the wafer W that has undergone the process such as the plasma etching process is transferred from the load lock module 14b that is exclusive for output to the purge storage 26 via the bypass route 24. In addition, the wafer W processed in the purge storage 26 is left under the atmospheric pressure so that the processed wafer W reacts with the composition of air to generate and scatter the corrosive gas, and then, the wafer W is transferred to the loader module 15. Since it does not happen that the wafer W generating the corrosive gas is transferred to the loader module 15, the countermeasures against the corrosion with respect to the loader module 15 are not necessary. Since the gate valves of the purge storage 26 are closed unless the wafer W passes through the gate valves, leakage of the corrosive gas from the purge storage 26 to the loader module 15 may be prevented.

Moreover, since the operations of the main transfer unit 18 can be shared with the sub-transfer unit 36 in the bypass route 24, the sub-transfer unit 36 and the main transfer unit 18 can be driven simultaneously, and thus, a throughput of the substrate processing apparatus 11 may be improved. That is, while the sub-transfer unit 36 transfers the processed wafer W from the load lock module 14b exclusive for output to the purge storage 26, the main transfer unit 18 may transfer the processed wafer W from the purge storage 26 to the FOUP.

In addition, when times of performing processes in the process modules 13a through 13d are irregular and the wafer W is transferred from the process modules 13a through 13d and to the load lock module 14b irregularly, the purge storage 26 may function as a buffer of the processing time, and thus, the main transfer unit 18 may be driven regularly regardless of the irregular processing times.

Figure 3:
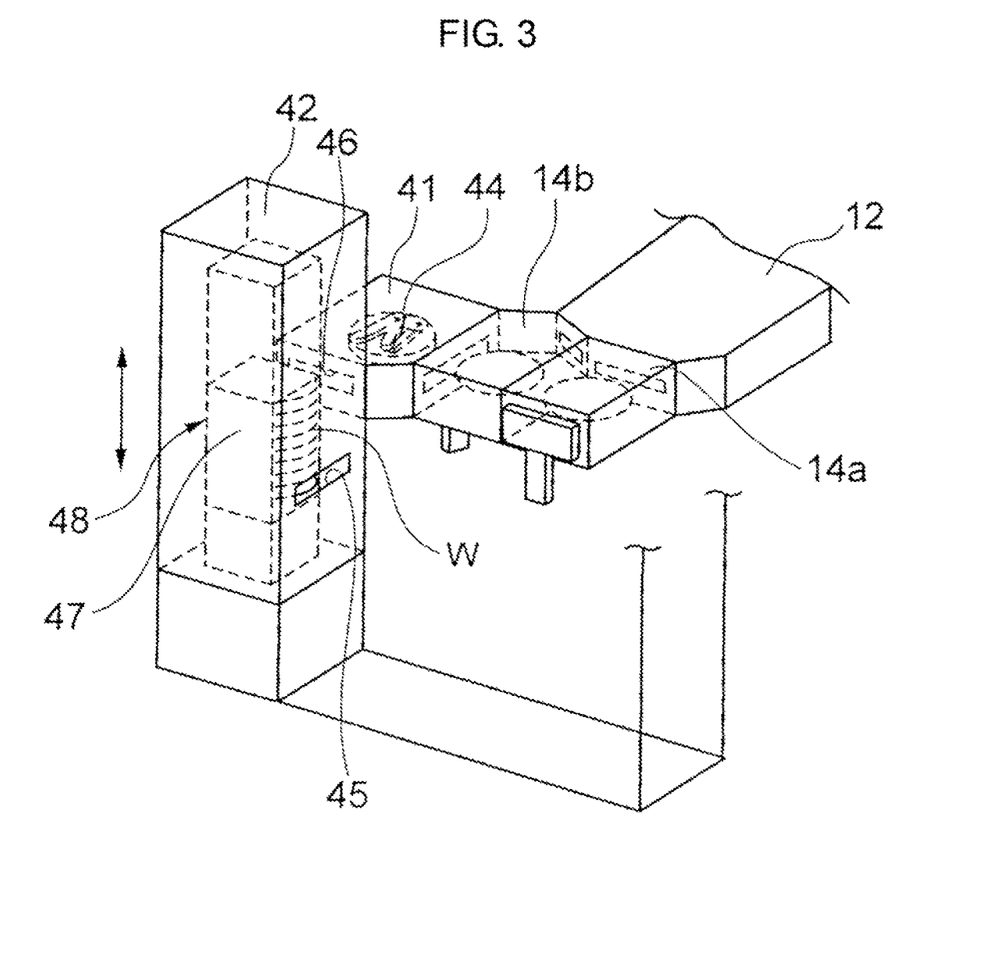
FIG. 3 is a schematic perspective view of a substrate processing apparatus according to another embodiment of the present invention.

FIG. 3 is a schematic perspective view of a substrate processing apparatus according to another embodiment of the present invention. In the substrate processing apparatus 11 of the present embodiment, configurations of a bypass route 41, a sub-transfer unit 44 provided in the bypass route 41, and a purge storage 42 are different from those of the substrate processing apparatus described in the previous embodiment. Configuration of the loader module 15, the load lock modules 14a and 14b, and the transfer module 12 are, however, the same as those of the previous embodiment, and thus, the same reference numerals are used and detailed descriptions of the components will not be provided.

In the present embodiment, a carry-out opening 45 of the purge storage 42 is formed as a horizontally-long slit shape so that the air contaminated by the corrosive gas of the purge storage 42 does not flow out to the purge storage 42 from the loader module 15. Likewise, a carry-in opening 46 of the purge storage 42 is also formed as a horizontally-long slit shape. Gate valves G5 and G6 opening/closing the carry-in opening 46 and the carry-out opening 45 of the purge storage 42 include sealing surfaces corresponding to the openings formed as the slits.

The sub-transfer unit 44 disposed in the bypass route 41 does not include the up-and-down driving axis that moves the wafer W in the up-and-down direction, unlike the substrate processing apparatus 11 of the previous embodiment. Instead of the up-and-down driving axis, a substrate moving mechanism 48 that elevates and descends a plurality of wafers W is provided in the purge storage 42. The substrate moving mechanism 48 includes a cassette 47 receiving the plurality of wafers W in the up-and-down direction, and a cassette driving axis for elevating and descending the cassette 47. A plurality of wafer receiving portions are formed in the cassette 47 in the up-and-down direction. The wafer receiving portions in the cassette 47 may be accessible from two directions, that is, from the bypass route 41 and the loader module 15. The sub-transfer unit 44 of the present embodiment may move an arm transferring mechanism in the up-and-down direction so as to collect the processed wafer W from the load lock module 14b.

The wafer W is transferred as follows between the sub-transfer unit 44 and the substrate moving mechanism 48 of the purge storage 42. First, the substrate moving mechanism 48 elevates or descends the receiving portion of the cassette 47 to the height of the carry-in opening 46 of the purge storage 42. In the meantime, the sub-transfer unit 44 collects the wafer W from the load lock module 14b that is exclusive for output, and places the collected wafer W in the receiving portion of the cassette 47 through the carry-in opening 46.

The wafer W is transferred as follows between the substrate moving mechanism 48 of the purge storage 42 and the main transfer unit 18. First, the substrate moving mechanism 48 elevates or descends the receiving portion of the cassette 47 to the level of the carry-out opening 45 of the purge storage 42. In the meantime, the main transfer unit 18 collects the wafer W from the receiving portion of the cassette 47, and transfers the collected wafer W to the loader module 15 through the carry-out opening 45.

According to the substrate processing apparatus of the present embodiment, the operation of transferring the wafer W into/from the purge storage 42 by the sub-transfer unit 44 or the sub-transfer unit 18 and the operation of elevating or descending the cassette 47 by the substrate moving mechanism 48 can be performed simultaneously, and thus, a throughput of the substrate processing apparatus can be improved.

Figure 4:
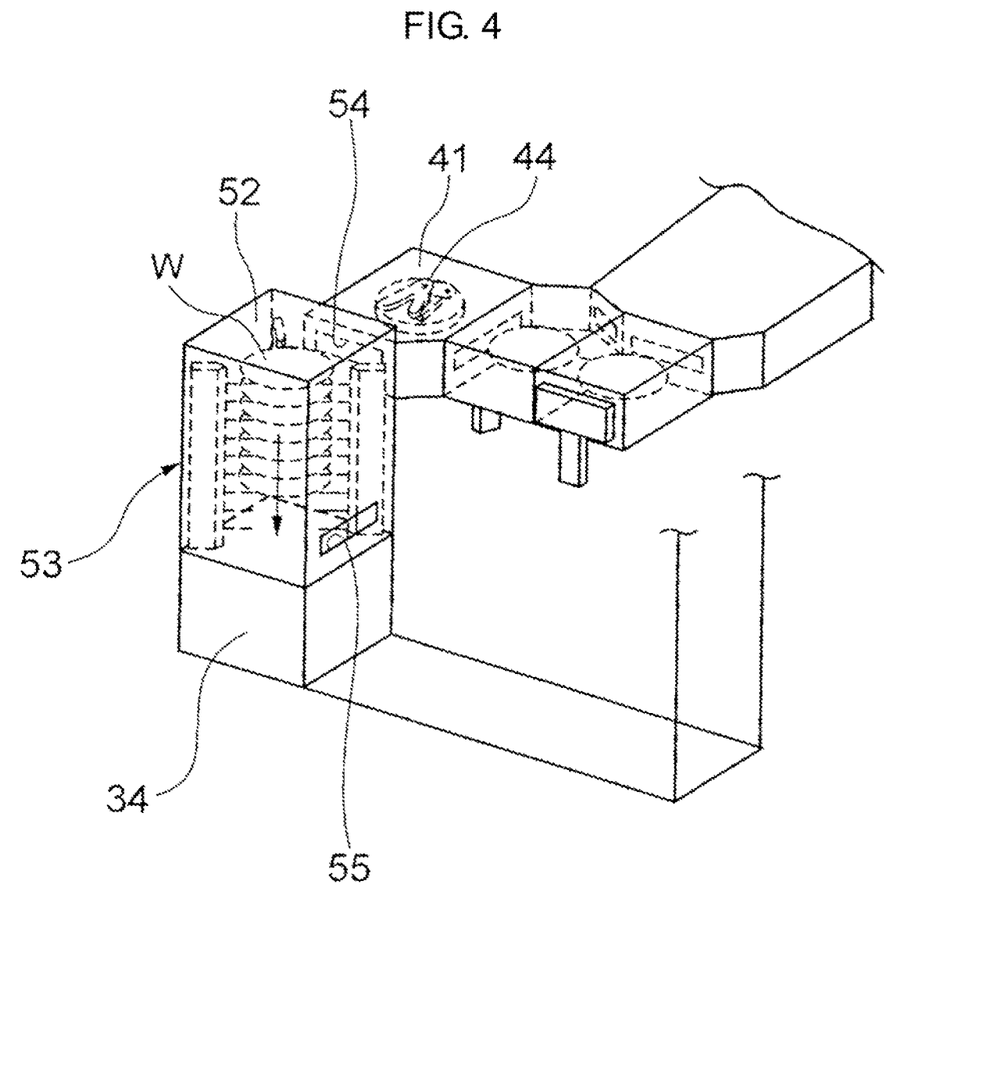
FIG. 4 is a schematic perspective view of a substrate processing apparatus according to still another embodiment of the present invention.

FIG. 4 is a schematic perspective view of a substrate processing apparatus according to another embodiment of the present invention. A substrate moving mechanism 53 for descending a plurality of wafers W is formed in a purge storage 52 of the present embodiment. The purge storage 52 includes a carry-in opening 54 formed as a slit shape at a location corresponding to the uppermost wafer W and a carry-out opening 55 formed as a slit shape at a location corresponding to the lowermost wafer W.

Figure 5:
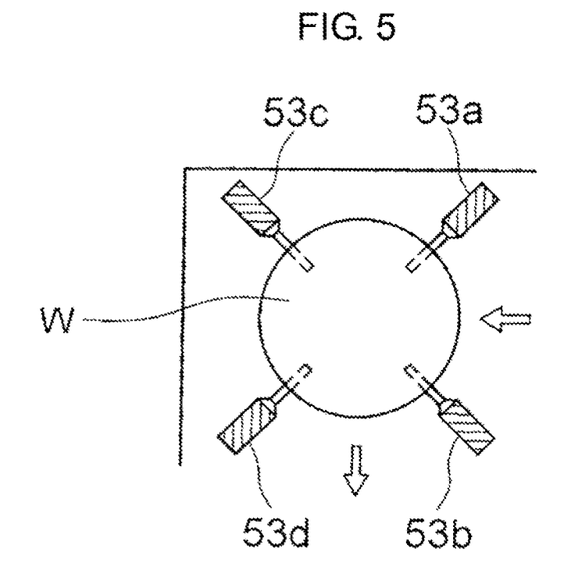
FIG. 5 is a schematic plan view of a purge storage in a substrate processing apparatus according to still another embodiment of the present invention.

As illustrated in the plan view of the purge storage 52 of FIG. 5, the substrate moving mechanism 53 includes four belt units 53a through 53d that are arranged along a circumferential direction of the wafer W with constant intervals, that is, 90°. The four belt units 53a and 53d are arranged with the intervals so that the wafer W may be transferred into/from by the sub-transfer unit 44 and the main transfer unit 18.

Figure 6:
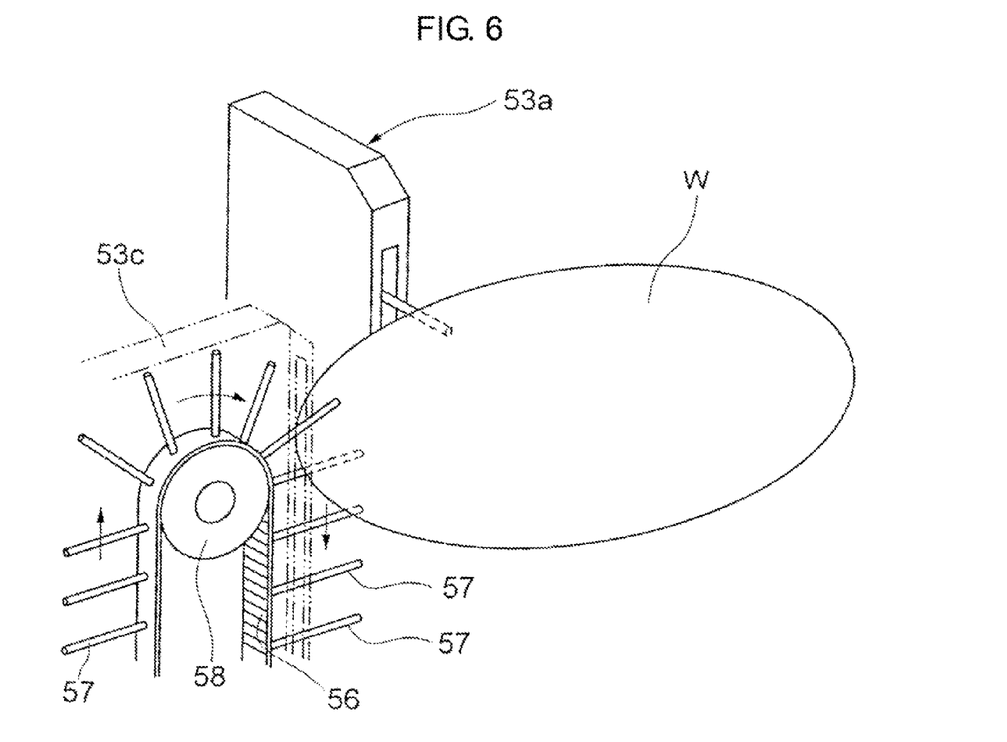
FIG. 6 is a perspective view of a belt unit supporting a wafer in the substrate processing apparatus.
Figure 7:
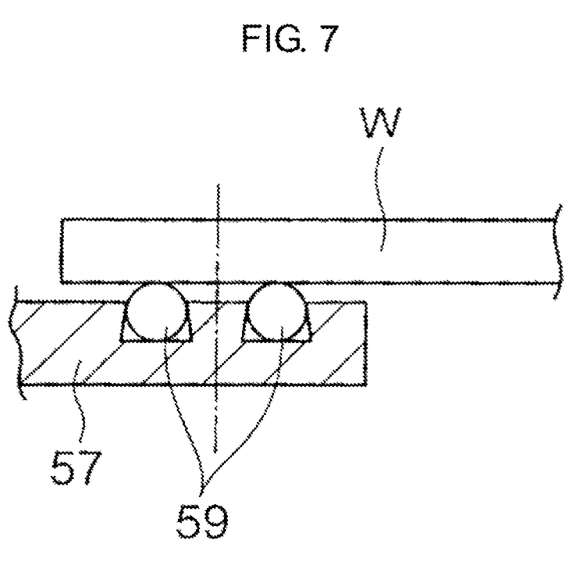
FIG. 7 is a cross-sectional view of a front end portion of a supporting portion in the belt unit.

As illustrated in the perspective view of the belt unit in FIG. 6, each of the belt units 53a through 53d includes a belt 56 of an endless type, supporting portions 57 of comb shapes attached to the belt 56 with predetermined intervals, and a plurality of pulleys, on which the endless type belt 56 is placed. The comb-shaped supporting portions 57 protrude toward a center portion of the wafer W, and front end portions of the supporting portions 57 support the wafer W. As illustrated in FIG. 7, wafer contacting portions 59 such as an elastomer are attached to the front end portion of the comb-shaped supporting portion 57. The supporting portions 57 support the wafer W by friction generating between the wafer contacting portions 59 and the wafer W. The belt 56 is formed of a corrosion-resistant resin material. When the pulleys 58 are driven in a direction to circulate the belt 56, the plurality of wafers W supported by the plurality of supporting portions 57 can be descended and the supporting portions 57 descending to a lower end portion of the belt 56 can be elevated back to an upper end portion of the belt 56.

According to the substrate processing apparatus of the present embodiment, a height of the purge storage 52 can be further lower as compared with the previous embodiment, in which the cassette 47 is moved in the up-and-down direction. In addition, since the wafer W transferred into the upper portion of the purge storage 52 is descended, and then, transferred from the lower portion of the purge storage 52, internal environment of the purge storage 52 can be maintained constantly.

Figure 8:
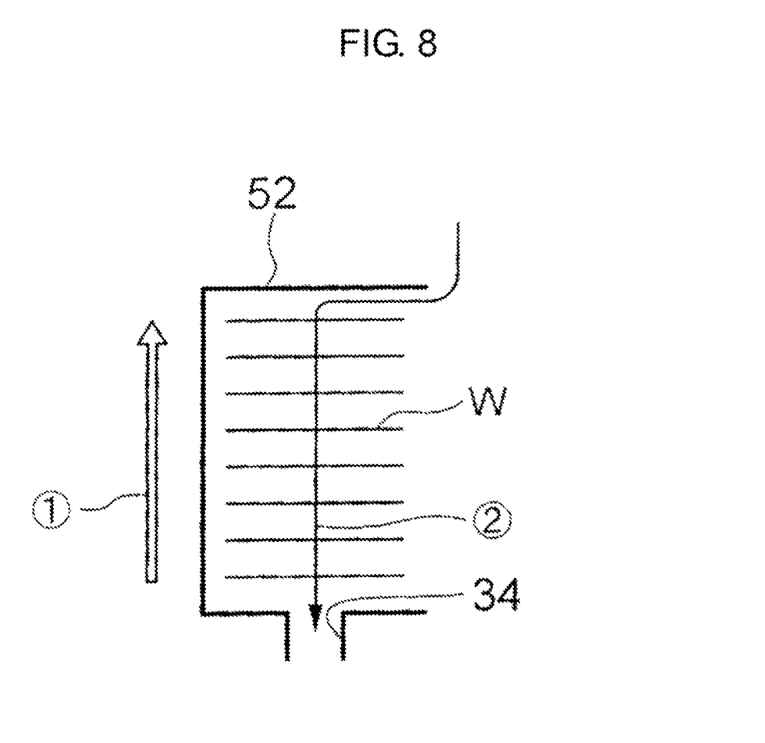
FIG. 8 is a schematic cross-sectional view of a purge storage showing an example, in which clean air flows in an opposite direction to a moving direction of a wafer.

FIG. 8 illustrates an example, in which a moving direction of the wafer W is opposite to a flowing direction of the clean air in the purge storage 52. In the example illustrated in FIG. 8, the wafer W is transferred into the lower end portion of the purge storage 52, and then, the plurality of wafers W are slowly elevated upward as denoted by arrow ①. In addition, the clean air in the purge storage 52 flows from the upper side to the lower side as denoted by arrow ②. That is, the moving direction ① of the plurality of wafers W and the flowing direction ② of the clean air are opposite to each other.

According to the present example, the environment in the purge storage 52 is gradually improved as the wafers W elevate, and thus, the clean air that is not mixed with the corrosive gas can flow to the wafer W directly before transferring the wafer from the purge storage 52. Therefore, the wafer W transferred from the purge storage 52 can be clean.

The substrate processing apparatus of the present invention is not limited to the above embodiments, but can be modified variously without changing the scope of the present invention.

For example, in order to improve the throughput of the substrate processing apparatus, two load lock modules that are exclusive for input may be provided so that two wafers can be transferred from the load lock module to the transfer module. In addition in order to improve the throughput, two load lock modules that are exclusive for output, the bypass route and the purge storage may be disposed on both sides of the two load lock modules exclusive for input.

In addition, the load lock module exclusive for output may be connected to the loader module, and the gate valve may be disposed on the connecting portion between the load lock module exclusive for output and the loader module. If the gas that is likely to generate the corrosive gas is not used in the process chambers, the gate valve may be opened so that the processed wafer is returned to the FOUP from the load lock module exclusive for output through the loader module.

In addition, cooling air for cooling down the processed wafer may flow in the bypass route. Then, the time for cooling the processed wafer in the load lock module exclusive for output can be reduced, and thus, the throughput of the substrate processing apparatus can be improved.

In addition, when the products generated from the processed substrate are removed in the purge storage, a gas (for example, steam) that may prompt purging can be added to the air in the storage. The purging may be performed under the inert gas (for example, nitrogen) environment, not under the atmosphere. In this case, the process is adjusted by the time taken for purging, not by the reaction with the atmosphere. Besides the atmosphere or the inert gas, a gas having similar components to that of the atmosphere, for example, a mixture gas of nitrogen and oxygen, may be used. The pressure in the storage may be greater than the pressure in the vacuum process chamber, and is not limited to the atmospheric pressure.

The substrate processing apparatus of the present invention may process substrates for liquid crystal, the substrate of the organic EL devices, etc. without being limited to the vacuum processing of the semiconductor wafer.

According to the present invention, the bypass route is provided between the load lock chamber and the storage so that the processed substrate may not pass through the atmospheric pressure transfer chamber, and thus, it is not necessary to perform the large-scale countermeasures against the corrosion of the atmospheric pressure transfer chamber. Moreover, the operations of the main transfer unit are shared with the sub-transfer unit, and then, the sub-transfer unit in the bypass route and the main transfer unit in the atmospheric pressure transfer chamber can be driven together. Thus, the throughput of the substrate processing apparatus can be improved.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A substrate processing apparatus comprising:
   a holding stage on which a transport container receiving a plurality of substrates is placed;
   a depressurized process chamber which processes a substrate of said plurality of substrates under a depressurized atmosphere;
   a load lock chamber which transfers the substrate from/to the depressurized process chamber, and is switchable between the depressurized atmosphere and an atmospheric pressure;
   an atmospheric pressure transfer chamber which has a main transfer unit for transferring the substrate received in the transport container from the holding stage to the load lock chamber under the atmospheric pressure; and
   a storage that holds the processed substrate under an atmosphere of a pressure higher than the pressure of the depressurized atmosphere,
   wherein a bypass route is provided in order to transfer the processed substrate from the load lock chamber to the storage without passing through the atmospheric pressure transfer chamber,
   a sub-transfer unit is provided in the bypass route for transferring the processed substrate from the load lock chamber to the storage, and
   the main transfer unit in the atmospheric pressure transfer chamber transfers the processed substrate from the storage to the transport container on the holding stage,
   wherein the storage comprises a substrate moving mechanism which includes a plurality of receiving portions for receiving the plurality of processed substrates in an up-and-down direction and elevates and/or descends the plurality of substrates received in the plurality of receiving portions, and
   the sub-transfer unit transfers the processed substrate to one of the receiving, portions in the substrate moving mechanism that is elevated or descended to a predetermined level,
   wherein the substrate moving mechanism of the storage comprises:
   an endless type belt;
   a plurality of supporting portions attached to the belt with predetermined intervals for supporting the plurality of substrates; and
   a pulley, on which the belt is placed, circulating the belt, and
   wherein the belt is circulated so that the plurality of supporting portions are moved in an up-and-down direction and a supporting portion of said plurality of supporting portions moved to one end in the up-and-down direction returns to the other end in the up-and-down direction.

2. The substrate processing apparatus of claim 1, wherein the load lock chamber comprises a load lock chamber that is exclusive for input and transfers the substrate to the depressurized process chamber, and a load lock chamber that is exclusive for output and transfers the substrate from the depressurized process chamber,
   the main transfer unit in the atmospheric pressure transfer chamber transfers an unprocessed substrate of said plurality of substrates received in the transport container on the holding stage to the load lock chamber exclusive for input, and
   the sub-transfer unit in the bypass route transfers the processed substrate from the load lock chamber exclusive for output to the storage.

3. The substrate processing apparatus of claim 1, wherein a carry-in opening, into which the processed substrate is transferred from the bypass route, and a carry-out opening, from which the processed substrate is transferred to the atmospheric pressure transfer chamber, are provided in the storage, and gate valves for opening/closing the carry-in opening and the carry-out opening are provided on the carry-in opening and the carry-out opening of the storage.

4. The substrate processing apparatus of claim 1, wherein the storage comprises an exhaust device, which exhaust the air in the storage, formed on a lower portion in the storage so that the air flows from an upper portion to the lower portion of the storage, and the substrate moving mechanism of the storage elevates the plurality of processed substrates from the lower side of the storage to the upper side of the storage.

* * * * *